United States Patent
Chen et al.

(10) Patent No.: US 8,093,512 B2
(45) Date of Patent: Jan. 10, 2012

(54) PACKAGE OF ENVIRONMENTALLY SENSITIVE ELECTRONIC DEVICE AND FABRICATING METHOD THEREOF

(75) Inventors: Kuang-Jung Chen, Hsinchu County (TW); Jia-Chong Ho, Hsinchu County (TW); Jing-Yi Yan, Taoyuan County (TW); Shu-Tang Yeh, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 418 days.

(21) Appl. No.: 12/487,658

(22) Filed: Jun. 19, 2009

(65) Prior Publication Data
US 2010/0258346 A1    Oct. 14, 2010

(30) Foreign Application Priority Data
Apr. 10, 2009 (TW) .............................. 98112021 A

(51) Int. Cl.
*H01L 23/28* (2006.01)

(52) U.S. Cl. ........ 174/523; 174/521; 174/524; 174/564; 29/592.1

(58) Field of Classification Search .................. 174/521, 174/523, 524, 564; 257/687; 29/592.1
See application file for complete search history.

(56) References Cited

U.S. PATENT DOCUMENTS

| | | | | |
|---|---|---|---|---|
| 4,788,626 A * | 11/1988 | Neidig et al. | ................. | 361/715 |
| 6,576,351 B2 | 6/2003 | Silvernail | | |
| 6,717,052 B2 * | 4/2004 | Wang et al. | ................... | 174/381 |
| 6,818,979 B2 * | 11/2004 | Takehara et al. | .............. | 257/687 |
| 6,866,901 B2 | 3/2005 | Burrows et al. | | |
| 7,306,852 B2 * | 12/2007 | Komada | ......................... | 428/446 |
| 7,489,031 B2 * | 2/2009 | Roberts et al. | ................ | 257/687 |
| 7,790,237 B2 * | 9/2010 | Gong et al. | ................... | 427/402 |
| 2005/0249901 A1 | 11/2005 | Yializis et al. | | |
| 2006/0226523 A1 | 10/2006 | Foust et al. | | |
| 2006/0255449 A1 * | 11/2006 | Lee et al. | ....................... | 257/698 |
| 2006/0278969 A1 * | 12/2006 | Thurgood | ..................... | 257/687 |
| 2007/0172971 A1 | 7/2007 | Boroson | | |
| 2008/0006819 A1 | 1/2008 | McCormick et al. | | |

FOREIGN PATENT DOCUMENTS

| | | |
|---|---|---|
| TW | 570472 | 1/2004 |
| TW | 200603416 | 1/2006 |

\* cited by examiner

*Primary Examiner* — Hung Ngo
(74) *Attorney, Agent, or Firm* — Jianq Chyun IP Office

(57) ABSTRACT

A package of an environmentally sensitive electronic device including a first substrate, a second substrate, an environmentally sensitive electronic device, a plurality of barrier structures, and a fill is provided. The second substrate is disposed above the first substrate. The environmentally sensitive electronic device is disposed on the first substrate and located between the first substrate and the second substrate. The barrier structures are disposed between the first substrate and the second substrate, wherein the barrier structures surround the environmental sensitive electronic device, and the water vapor transmission rate of the barrier structures is less than $10^{-1}$ g/m$^2$/day. The fill is disposed between the first substrate and the second substrate and covers the environmentally sensitive electronic device and the barrier structures.

25 Claims, 14 Drawing Sheets

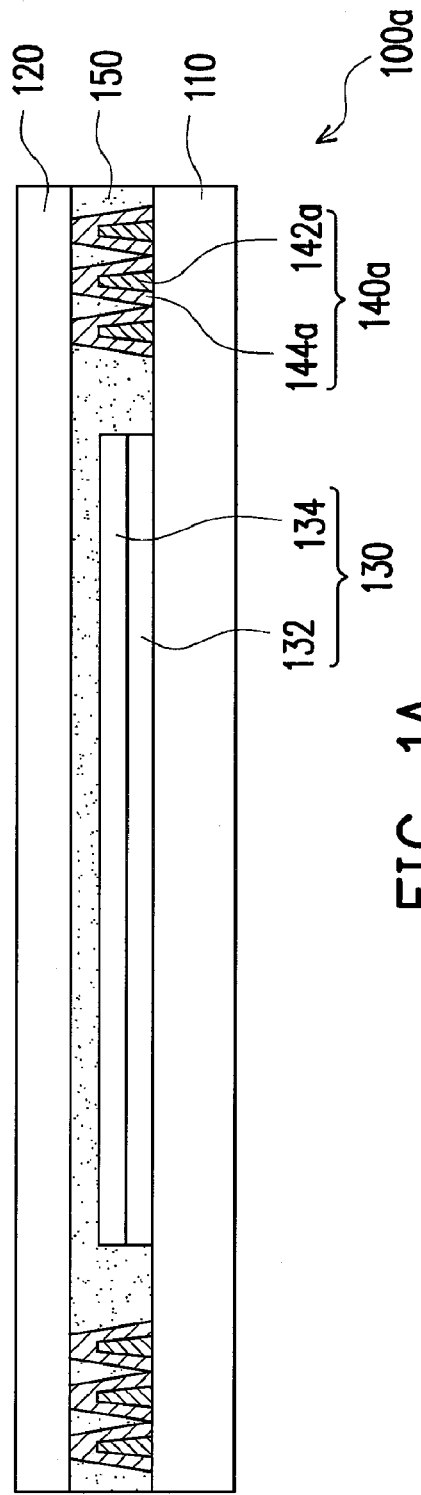
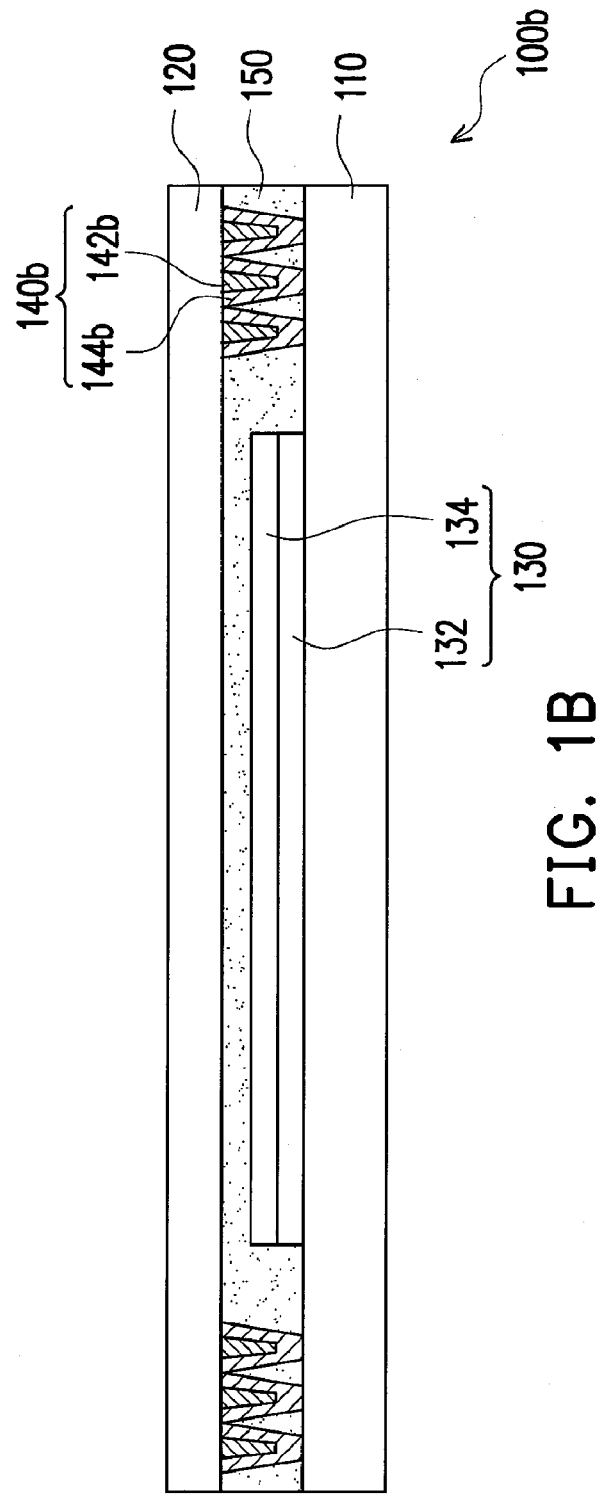

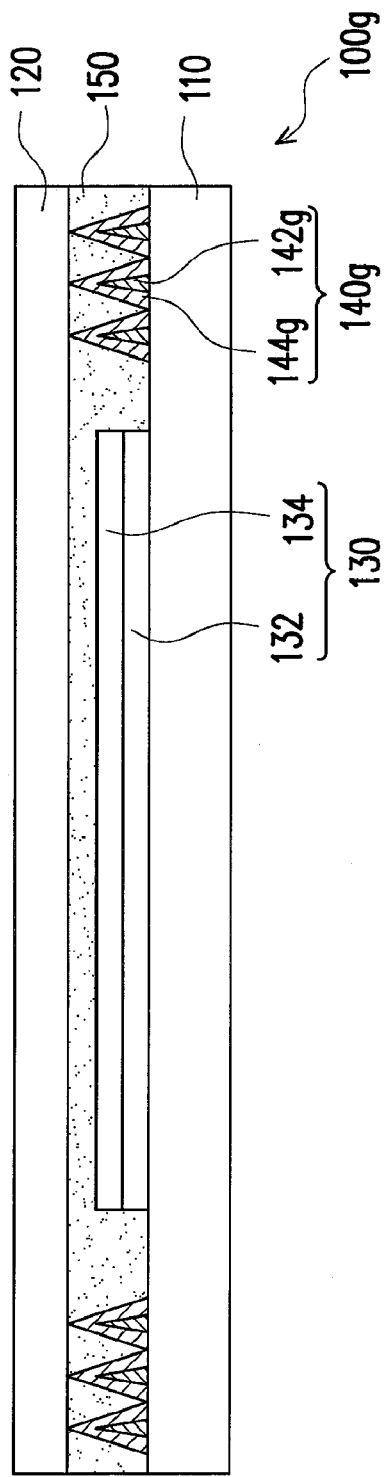
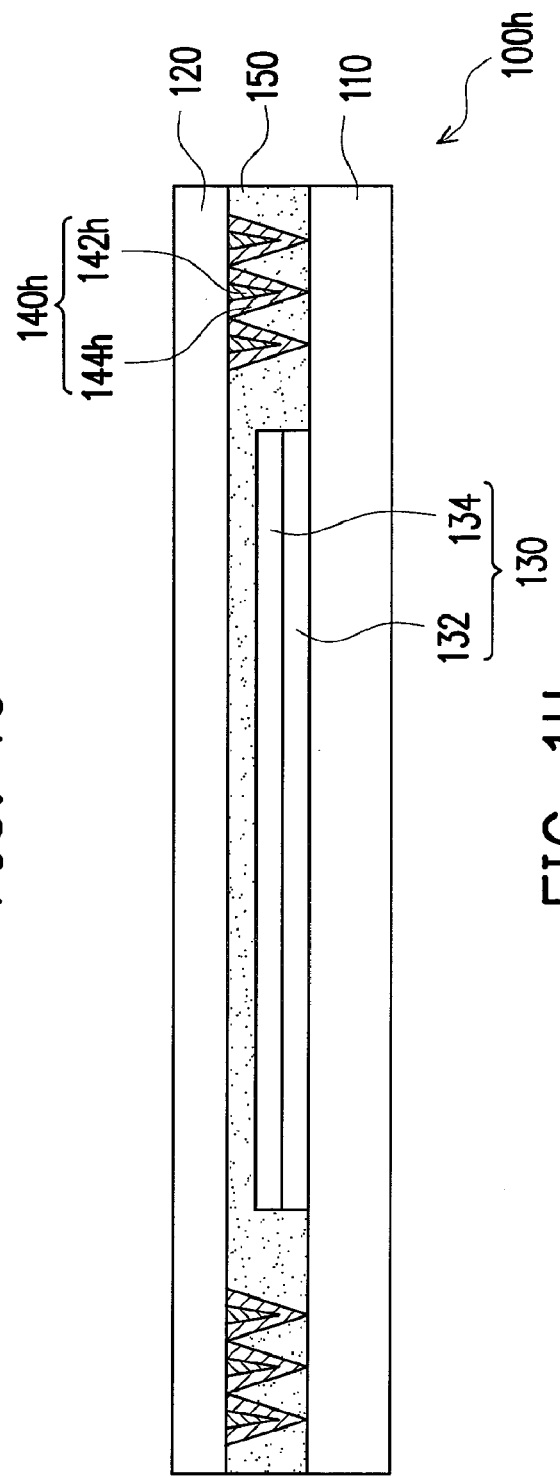

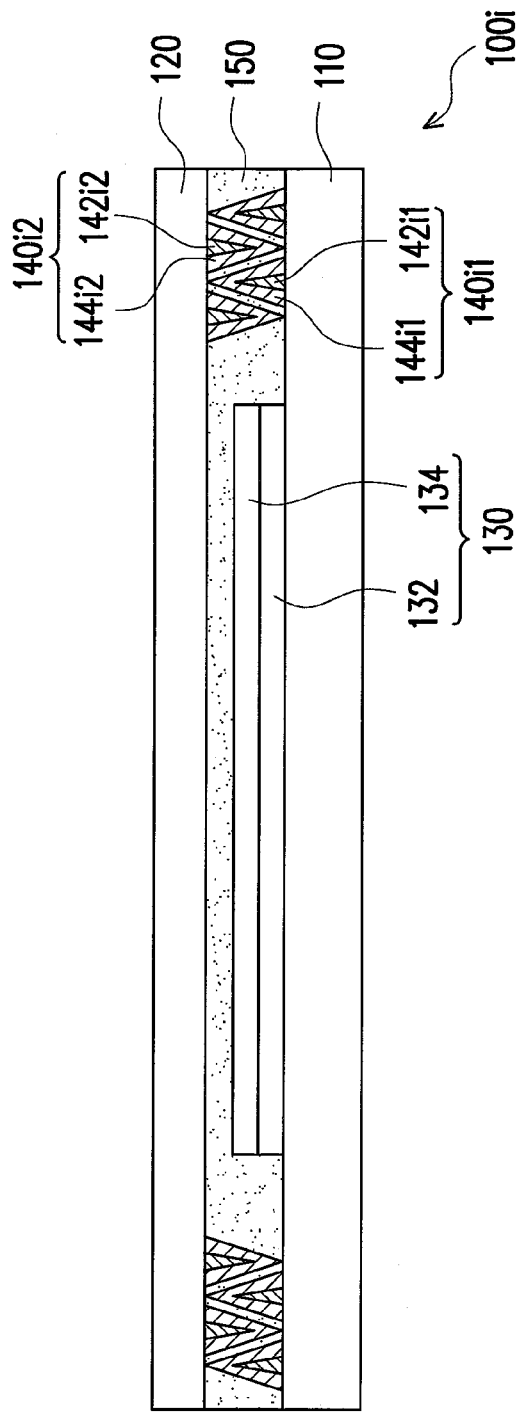
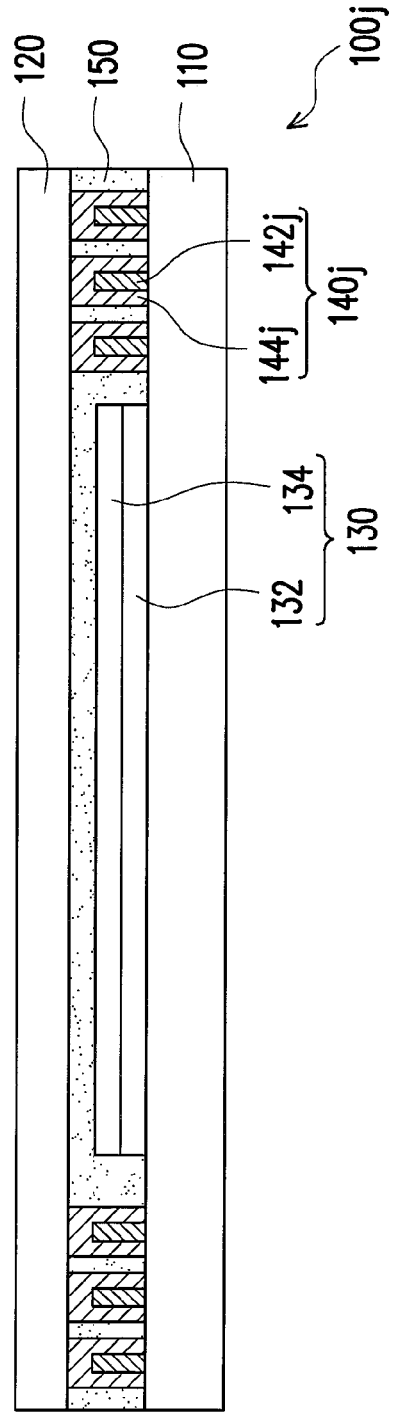
FIG. 1I
FIG. 1J

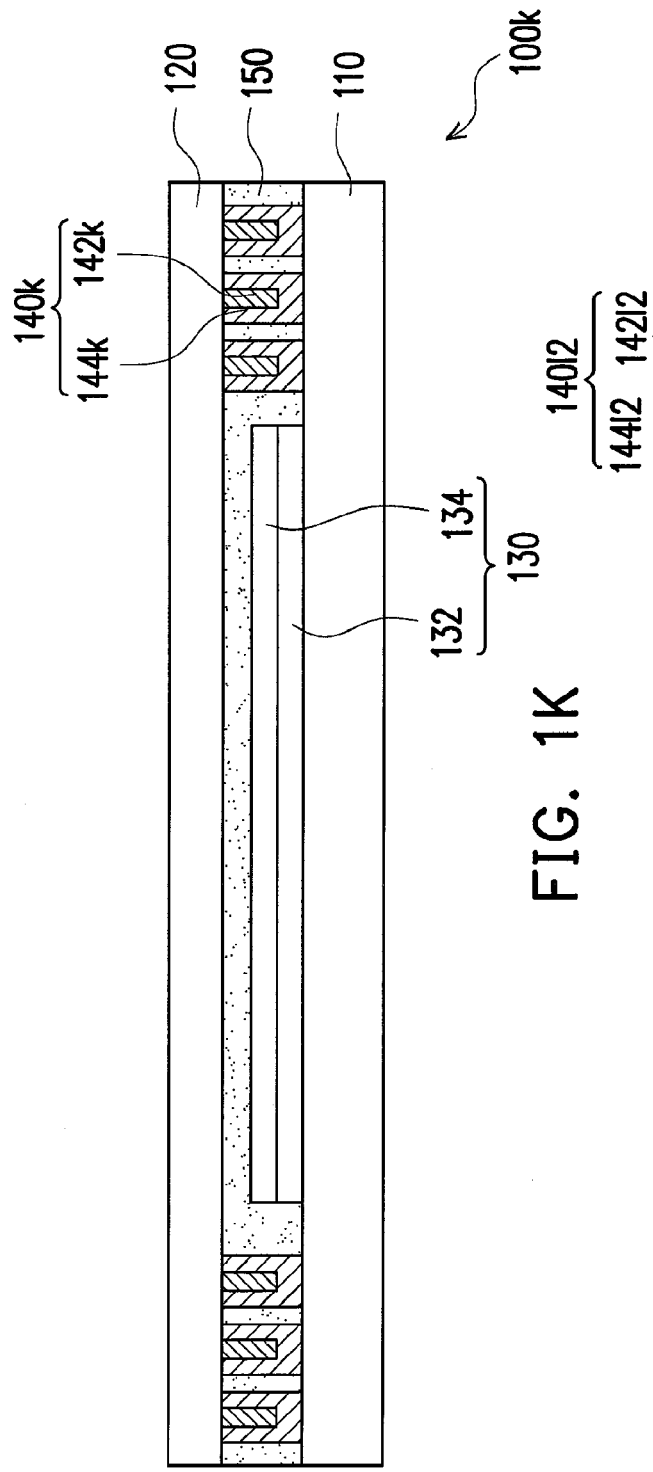
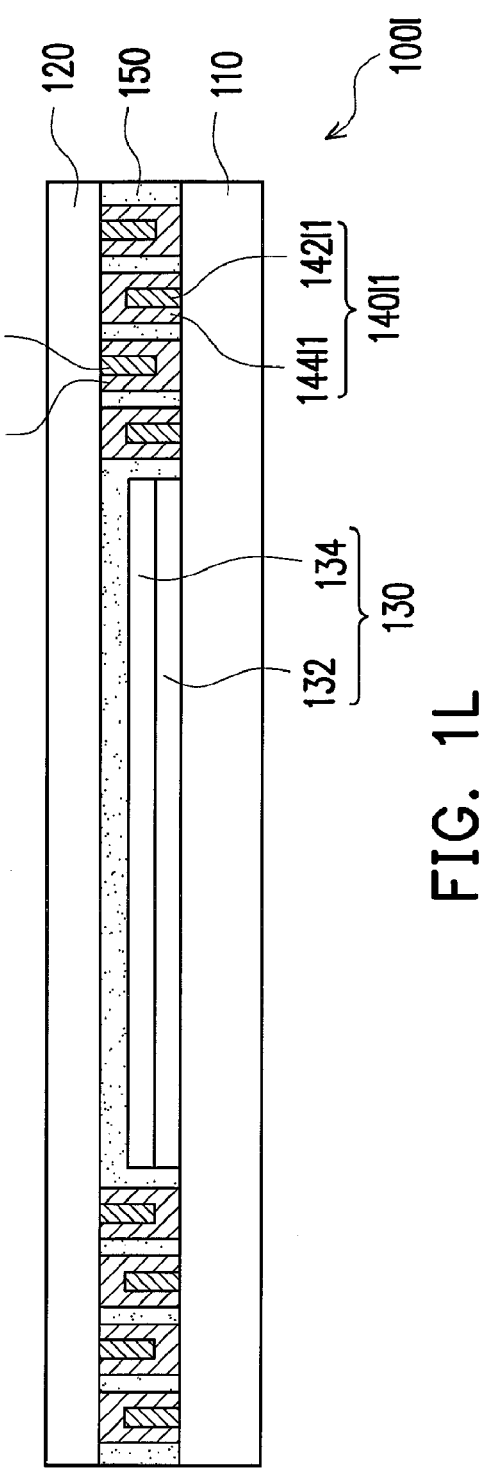
FIG. 1K
FIG. 1L

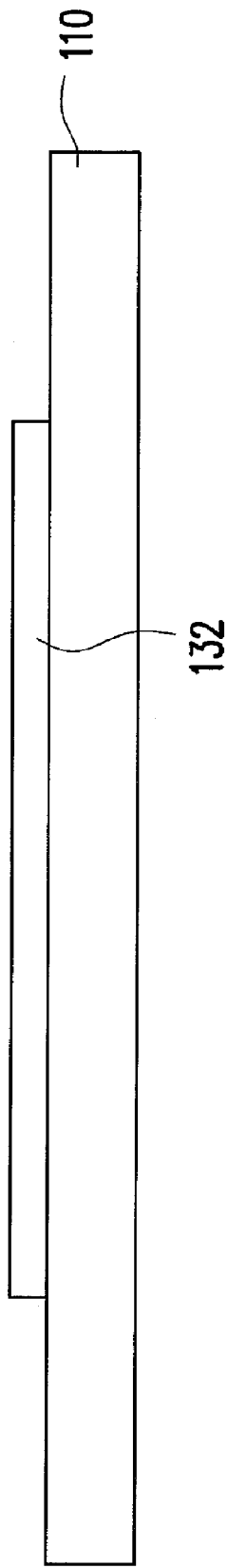
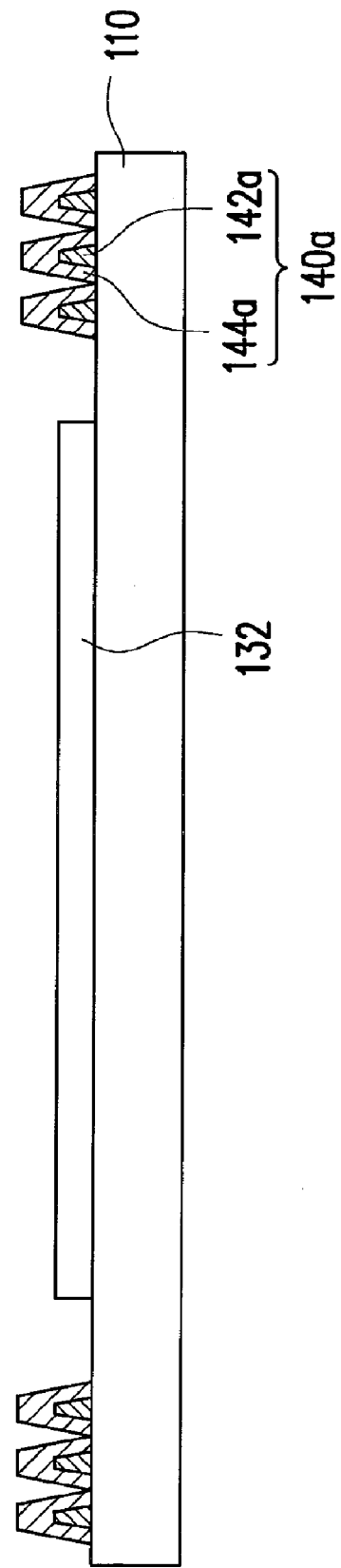

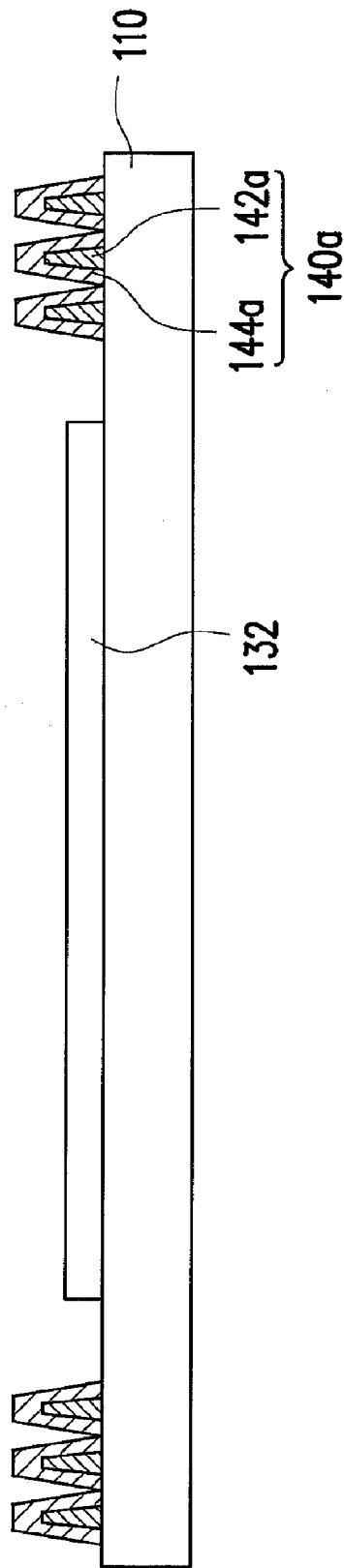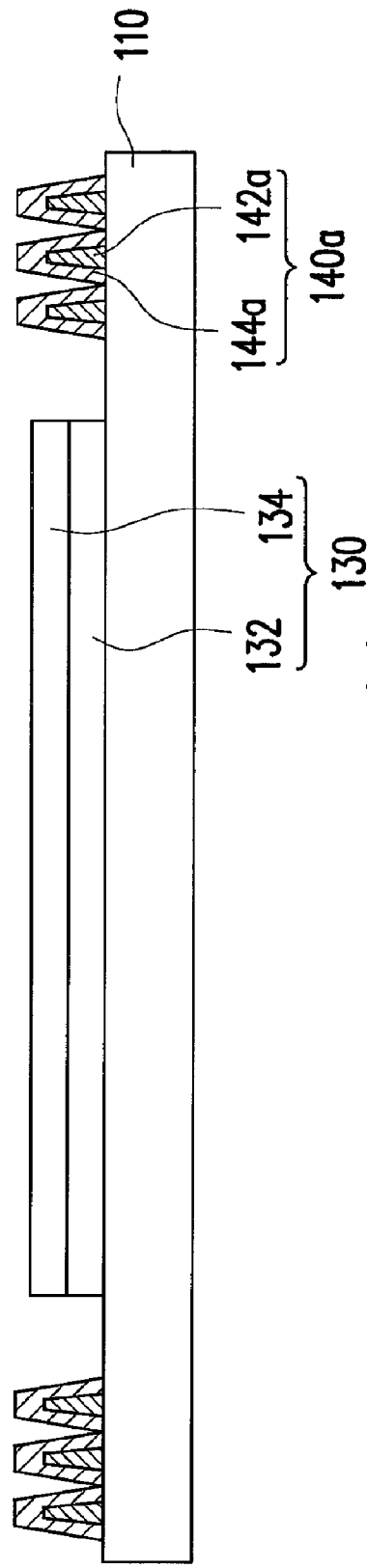

PACKAGE OF ENVIRONMENTALLY SENSITIVE ELECTRONIC DEVICE AND FABRICATING METHOD THEREOF

CROSS-REFERENCE TO RELATED APPLICATION

This application claims the priority benefit of Taiwan application Ser. No. 98112021, filed Apr. 10, 2009. The entirety of the above-mentioned patent application is hereby incorporated by reference herein and made a part of specification.

BACKGROUND OF THE INVENTION

1. Field of the Invention

The present invention generally relates to a side wall barrier and a fabricating method thereof More particularly, the present invention relates to a side wall barrier of an environmentally sensitive electronic device and a fabricating method of an environmentally sensitive electronic device.

2. Description of Related Art

Compared with normal rigid substrates, flexible substrates have a wider range of applications due to their advantages of flexibility, ease of carriage, safety, and applications in consumer products. However, their drawbacks include a large coefficient of thermal expansion and poor resistance to heat, moisture, oxygen, and chemicals. Since typical flexible substrates cannot entirely avoid the transmission of water vapor and oxygen, devices on these substrates experience accelerated aging. Consequently, these devices with short lifetime fail to meet their commercial needs.

To solve the aforementioned problems, several conventional technical solutions have been proposed as improvements, such as Taiwan Patent No. 570472, Taiwan Patent Publication No. 200603416 (GE), U.S. Pat. No. 6,576,351 B2, U.S. Pat. No. 6,866,901 B2, U.S. Patent Publication No. 2005/0249901 A1, U.S. Patent Publication No. 2006/0226523 A1, U.S. Patent Publication No. 2007/0172971A1, and U.S. Patent Publication No. 2008/0006819 A1.

Taiwan Patent No. 570472 disclosed structural improvements to a package of a flexible optoelectronic device, wherein a high viscoelastic glue and inorganic nano-materials are mixed and dispensed outside the sealant of the non-display area of the optoelectronic device. However, the capability of blocking water vapor and oxygen transmission of the mixed high viscoelastic glue and inorganic nano-materials is not as good as that of metallic layers having the stacking structure of multiple organic layers or multiple inorganic/organic layers. In addition, the bonding reliability of the flexible optoelectronic device is worse.

Taiwan Patent Publication No. 200603416 (GE) disclosed organic electronic packages with hermetically sealed edges and methods of manufacturing such package. According to the disclosed methods, cover plates that are both water vapor and oxygen resistant are implemented to cover the edges of the device with the use of sealants. Although this method is more conducive to water vapor and oxygen resistance than a conventional device, water vapor and oxygen still transmit into the device through the edge sealant, thereby shortening the lifetime of the device.

U.S. Patent Publication No. 2007/0172971 A1 disclosed a method of packaging organic light emitting diodes (OLED), in which the OLED is surrounded by alternately placed sealant and water absorbent materials. However, the water absorbing materials have a limited capability for the absorption of water vapor, and when such a capability is reached, water vapor enters the device region and affects the lifetime of the OLED.

SUMMARY OF THE INVENTION

The present invention provides a package of an environmentally sensitive electronic device and a method of manufacturing the same.

The present invention provides a package of an environmentally sensitive electronic device including a first substrate, a second substrate, an environmentally sensitive electronic device, a plurality of barrier structures, and a fill. The second substrate is disposed over the first substrate. The environmentally sensitive electronic device is disposed on the first substrate and is sandwiched between the first substrate and the second substrate. The barrier structures are disposed between the first substrate and the second substrate. The barrier structures also surround the environmentally sensitive electronic device, and the water vapor transmission rate of these barrier structures is less than $10^{-1}$ g/m$^2$/day. The fill is disposed between the first substrate and the second substrate, and this fill covers the environmentally sensitive electronic device and the barrier structures.

The present invention provides a method of packaging an environmentally sensitive electronic device. First, an environmentally sensitive electronic device is formed on the first substrate. Next, a plurality of barrier structures is formed on the first substrate or the second substrate. These barrier structures surround the environmentally sensitive electronic device, and the water vapor transmission rate of these barrier structures is less than $10^{-1}$ g/m$^2$/day. Afterwards, a fill is formed on the first substrate. This fill covers the environmentally sensitive electronic device and the barrier structures. Finally, the second substrate is pressed on the fill.

As aforementioned, the barrier structures are located between the first substrate and the second substrate, and the barrier structures surround the environmentally sensitive device. In addition, the water vapor transmission rate of the barrier structures is less than $10^{-1}$ g/m$^2$/day. Hence, the side wall barrier in the present invention protects well against water vapor and oxygen, and the package of the present invention prolongs the lifetime of the environmentally sensitive electronic device accordingly. Additionally, when the device is bent, the side wall barrier structures, acting as structural supports, disperse stress for the package of the environmentally sensitive electronic device.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a schematic cross-sectional view illustrating a package of an environmentally sensitive electronic device in accordance with one embodiment of the present invention.

FIG. 1B is a schematic cross-sectional view illustrating a package of an environmentally sensitive electronic device in accordance with another embodiment of the present invention.

FIG. 1G is a schematic cross-sectional view illustrating a package of an environmentally sensitive electronic device in accordance with another embodiment of the present invention.

FIG. 1H is a schematic cross-sectional view illustrating a package of an environmentally sensitive electronic device in accordance with another embodiment of the present invention.

FIG. 1I is a schematic cross-sectional view illustrating a package of an environmentally sensitive electronic device in accordance with another embodiment of the present invention.

FIG. 1J is a schematic cross-sectional view illustrating a package of an environmentally sensitive electronic device in accordance with another embodiment of the present invention.

FIG. 1K is a schematic cross-sectional view illustrating a package of an environmentally sensitive electronic device in accordance with another embodiment of the present invention.

FIG. 1L is a schematic cross-sectional view illustrating a package of an environmentally sensitive electronic device in accordance with another embodiment of the present invention.

DESCRIPTION OF EMBODIMENTS

Figure 1C:
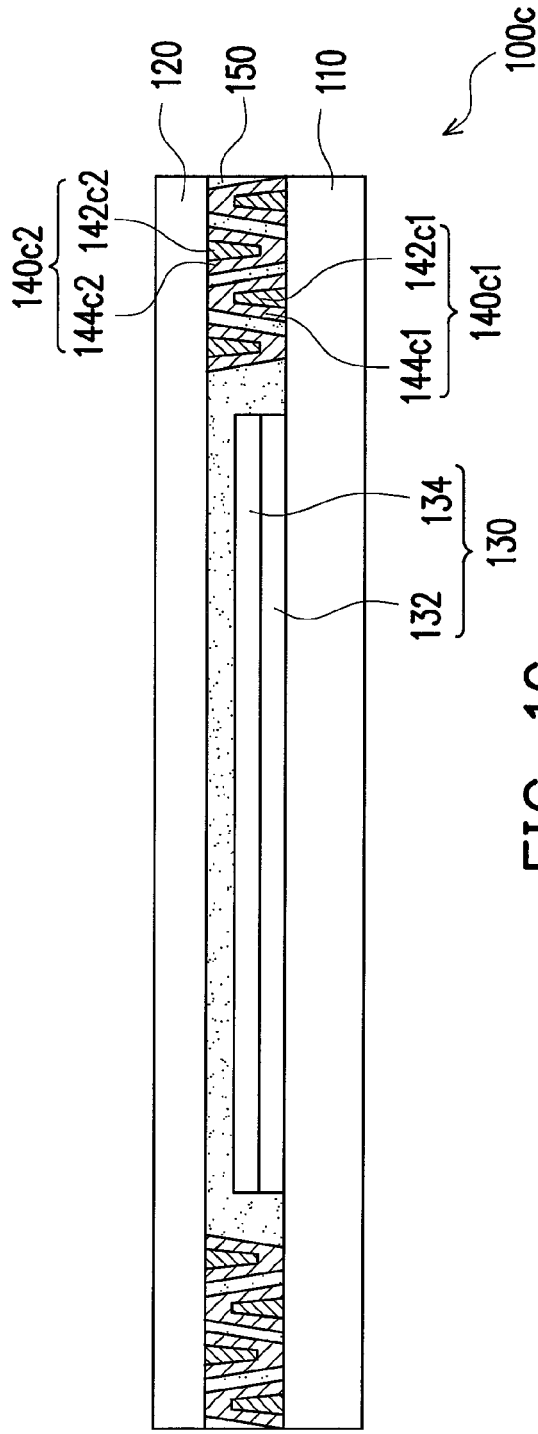
FIG. 1C is a schematic cross-sectional view illustrating a package of an environmentally sensitive electronic device in accordance with another embodiment of the present invention.

FIG. 1A is a schematic cross-sectional view of a package of an environmentally sensitive electronic device in accordance with one embodiment of the present invention. As shown in FIG. 1A, in the present embodiment of the invention, the package 100a having the environmentally sensitive electronic device includes a first substrate 110, a second substrate 120, an environmentally sensitive electronic device 130, a plurality of barrier structures 140a, and a fill 150.

Specifically, the second substrate 120 is disposed above the first substrate 110, and the first substrate 110 and the second substrate 120 can be a flexible substrate or a rigid substrate, for instance. A material for the flexible substrate is polyethylene terephthalate (PET), polyethylene naphthalate (PEN), polyethersulfone (PES), polymethylmathacrylate (PMMA), polycarbonate (PC), polyimide (PI), or metal foil. The flexible substrate can be a touch-sensing substrate. For instance, the flexible substrate 120 can be a surface capacitive touch-sensing panel, a digital matrix touch-sensing panel (e.g. projected capacitive touch-sensing panel), or an analogue matrix touch-sensing panel. The material for the rigid substrate can be glass. In the present embodiment of the invention, the first substrate 110 and the second substrate 120 are both flexible substrates.

The environmentally sensitive electronic device 130 is disposed on the first substrate 110 and is sandwiched between the first substrate 110 and the second substrate 120. The environmentally sensitive electronic device 130 includes an active device 132 (or a passive device) and a display medium 134. In the present embodiment of the invention, the environmentally sensitive electronic device 130 is, for instance, an active environmentally sensitive display device, or a passive environmentally sensitive display device. The environmentally sensitive active display device 130 is, for instance, an Active Matrix Organic Light Emitting Diode (AM-OLED), an Active Matrix Electro Phoretic Display (AM-EPD) commonly known as electronic paper, an Active Matrix Liquid Crystal Display (AM-LCD), or an Active Matrix Blue Phase Liquid Crystal Display. The passive environmentally sensitive display device includes, for instance, a Passive Matrix OLED (PM-OLED) or a Super Twisted Nematic Liquid Crystal Display (STN-LCD).

The barrier structures 140a are disposed between the first substrate 110 and the second substrate 120. The barrier structures 140a surround the environmentally sensitive electronic device 130, and the water vapor transmission rate of the barrier structures 140a is less than $10^{-1}$ g/m$^2$/day. Preferably, the water vapor transmission rate of the barrier structures 140a is less than $10^{-2}$ g/m$^2$/day. Furthermore, each of the barrier structures 140a includes a rib 142a and a barrier layer 144a. The ribs 142a are disposed on the first substrate 110 or the second substrate 120, and the smallest cross-sectional shape of the ribs 142a includes a trapezoidal shape, for instance. The barrier layers 144a cover the ribs 142a. In the present embodiment of the invention, the ribs 142a are disposed on the first substrate 110, and the ribs 142a are spaced at equidistant intervals. Moreover, the material of the ribs 142a includes organic polymer materials or organic-inorganic hybrid materials. An organic polymer material is a positive photoresist or a negative photoresist, for instance. The material of the barrier layers 144a includes an inorganic material, and the inorganic material is silicon oxide, silicon nitride, silicon oxynitride, or aluminum oxide, for instance. In addition, the material of the barrier layers 144a includes a metallic material, and the metallic material includes molybdenum, titanium, aluminum, chromium, molybdenum/aluminum/molybdenum, or titanium/aluminum/titanium, for instance.

The fill 150 is disposed between the first substrate 110 and the second substrate 120, and this fill 150 covers the environmentally sensitive electronic device 130 and the barrier layers 144a of the barrier structures 140a. In the present embodiment of the invention, the material of the fill 150 is acrylic resin or epoxy resin, for instance. The fill 150 is a pressure sensitive type glue or a fill type glue, for instance.

Since the barrier structures 140a having a water vapor transmission rate of less than $10^{-1}$ g/m$^2$ day are located between the first substrate 110 and the second substrate 120 and surround the environmentally sensitive electronic device 130, the package 100a in the present invention is well protected against water vapor and oxygen, and consequently the package 100a prolongs the lifetime of the environmentally sensitive electronic device 130 therein. Additionally, when the package 100a is bent, the side wall barrier structures 140a act as structural supports for the package 100a having the environmentally sensitive electronic device 130. In addition, the fill 150, the barrier layers 144a, and the ribs 142a (the latter two from the side wall barrier structures 140a) have stress dispersive characteristics due to their materials. The material of the fill 150, the barrier layers 144a, and the ribs 142a is an organic material, an inorganic material, and an organic material (or an organic-inorganic hybrid material), respectively.

It should be mentioned that the present invention does not limit the location or the type of the side wall barrier structures 140a. In the aforementioned embodiment of the present invention, the ribs 142a of the side wall barrier structures 140a are disposed on the first substrate 110, and the smallest cross-sectional shape of the ribs 142a is trapezoidal. However, other alternate structural designs can also be utilized without departing from the spirit of the present invention. The following are descriptions of different embodiments detailing the designs of packages 100b-100l having environmentally sensitive electronic devices.

FIG. 1B is a schematic cross-sectional view illustrating a package of an environmentally sensitive electronic device in accordance with another embodiment of the present invention. Referring to FIG. 1B, the package 100b shown in FIG. 1B is similar to the package 100a shown in FIG. 1A except that the side wall barrier structures 140b of the package 100b in FIG. 1B are disposed on the second substrate 120, and the smallest cross-sectional shape of the ribs 142b in FIG. 1B is inverse-trapezoidal when one skilled in the arts takes the smallest cross-sectional shape of the ribs 142a in FIG. 1A to be upright-trapezoidal.

FIG. 1C is a schematic cross-sectional view illustrating a package of an environmentally sensitive electronic device in accordance with another embodiment of the present invention. Referring to FIG. 1C, the package 100c shown in FIG. 1C is similar to the package 100b shown in FIG. 1B except that the ribs of the side wall barrier structures 140c1 and 140c2 of the package 100c include a plurality of first ribs 142c1 and a plurality of second ribs 142c2, wherein the first ribs 142c1 are disposed on the first substrate 110, the second ribs 142c2 are disposed on the second substrate 120, and the first ribs 142c1 and second ribs 142c2 are alternately arranged. The smallest cross-sectional shape of the ribs 142c1 in FIG. 1C is inverse-trapezoidal while the smallest cross-sectional shape of the ribs 142c2 in FIG. 1C is upright-trapezoidal.

Figure 1D:
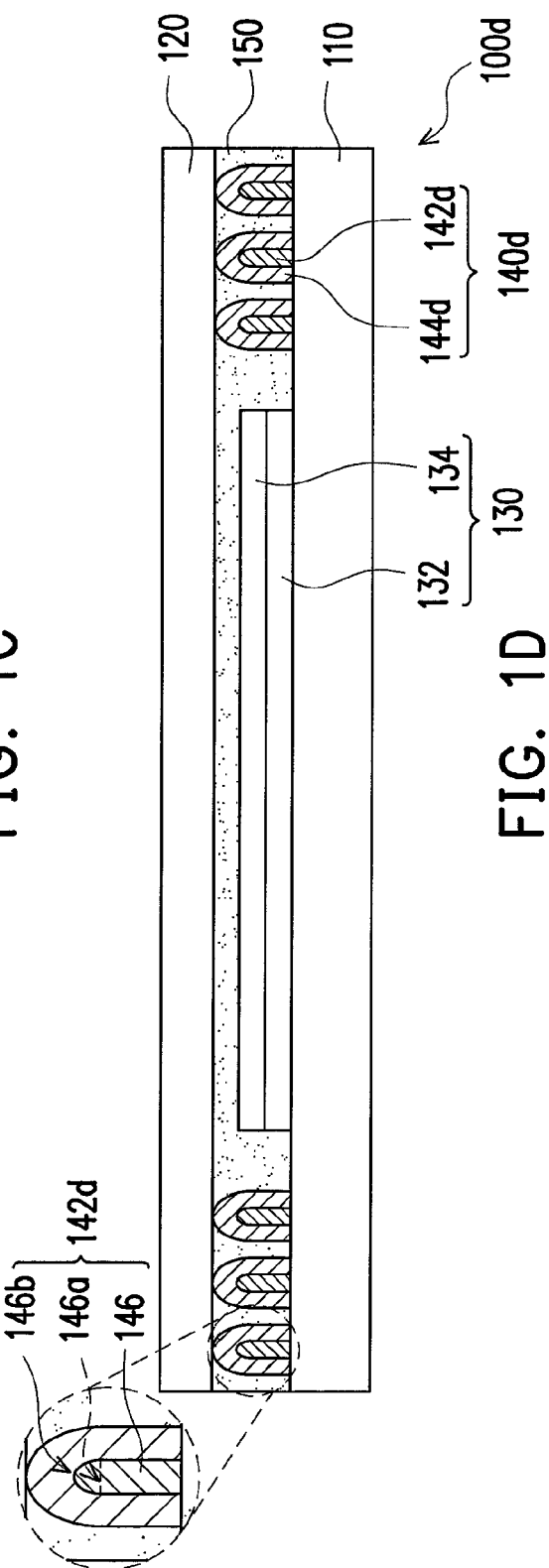
FIG. 1D is a schematic cross-sectional view illustrating a package of an environmentally sensitive electronic device in accordance with another embodiment of the present invention.

FIG. 1D is a schematic cross-sectional view illustrating a package of an environmentally sensitive electronic device in accordance with another embodiment of the present invention. Referring to FIG. 1D, the package 100d shown in FIG. 1D is similar to the package 100a shown in FIG. 1A except that the smallest cross-sectional shape of the ribs 142d from the side wall barrier structures 140d of the package 100d is a bullet shape 146, wherein the bullet shape 146 includes a rectangular portion and a rounding portion 146b connected to an upper planar region 146a of the rectangular portion, the upper planar region 146a is not in contact with the first substrate 110 directly.

Figure 1E:
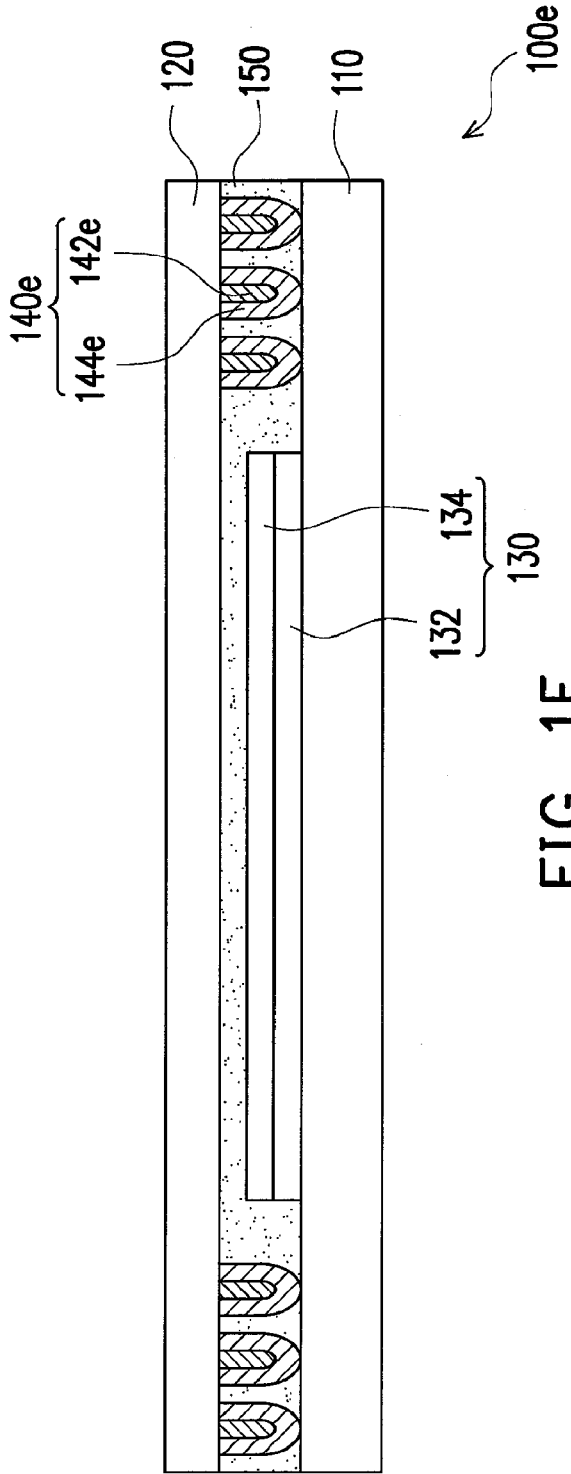
FIG. 1E is a schematic cross-sectional view illustrating a package of an environmentally sensitive electronic device in accordance with another embodiment of the present invention.

FIG. 1E is a schematic cross-sectional view illustrating a package of an environmentally sensitive electronic device in accordance with another embodiment of the present invention. Referring to FIG. 1E, the package 100e shown in FIG. 1E is similar to the package 100d shown in FIG. 1D except that the ribs 142e of the side wall barrier structures 140e of the package 100e are disposed on the second substrate 120.

Figure 1F:
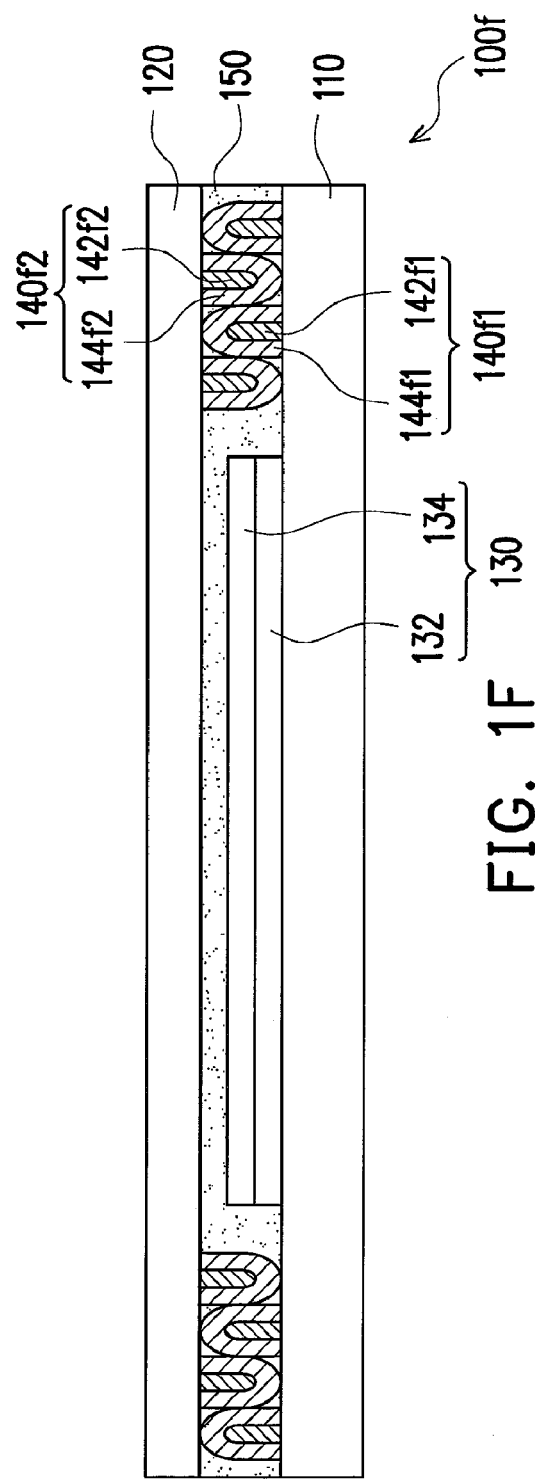
FIG. 1F is a schematic cross-sectional view illustrating a package of an environmentally sensitive electronic device in accordance with another embodiment of the present invention.

FIG. 1F is a schematic cross-sectional view illustrating a package of an environmentally sensitive electronic device in accordance with another embodiment of the present invention. Referring to FIG. 1F, the package 100f shown in FIG. 1F is similar to the package 100e shown in FIG. 1E except that the ribs from the barrier structures 140f1 and 140f2 of the package 100f include a plurality of first ribs 142f1 and a plurality of second ribs 142f2, wherein the first ribs 142f1 are disposed on the first substrate 110, the second ribs 142f2 are disposed on the second substrate 120, and the first ribs 142f1 and the second ribs 142f2 are alternately arranged.

FIG. 1G is a schematic cross-sectional view illustrating a package of an environmentally sensitive electronic device in accordance with another embodiment of the present invention. Referring to FIG. 1G, the package 100g shown in FIG. 1G is similar to the package 100a shown in FIG. 1A except that the smallest cross-sectional shape of the ribs 142g of the side wall barrier structures 140g of the package 100g is triangular.

FIG. 1H is a schematic cross-sectional view illustrating a package of an environmentally sensitive electronic device in accordance with another embodiment of the present invention. Referring to FIG. 1H, the package 100h shown in FIG. 1H is similar to the package 100g shown in FIG. 1G except that the ribs 142h of the side wall barrier structures 140h of the package 100h are disposed on the second substrate 120.

FIG. 1I is a schematic cross-sectional view illustrating a package of an environmentally sensitive electronic device shown in another embodiment of the present invention. Referring to FIG. 1I, the package 100i shown in FIG. 1I is similar to the package 100h shown in FIG. 1H except that the ribs of the side wall barrier structures 140i1 and 140i2 of the package 100i include a plurality of first ribs 142i1 and a plurality of second ribs 142i2, wherein the first ribs 142i1 are disposed on the first substrate 110, the second ribs 142i2 are disposed on the second substrate 120, the first ribs 142i1 and the second ribs 142i2 are alternately arranged.

FIG. 1J is a schematic cross-sectional view illustrating a package of an environmentally sensitive electronic device in accordance with another embodiment of the present invention. Referring to FIG. 1J, the package 100j shown in FIG. 1J is similar to the package 100a shown in FIG. 1A except that the smallest cross-sectional shape of the ribs 142j of the barrier structures 140j of the package 100j is rectangular.

FIG. 1K is a schematic cross-sectional view illustrating a package of an environmentally sensitive electronic device in accordance with another embodiment of the present invention. Referring to FIG. 1K, the package 100k shown in FIG. 1K is similar to the package 100j shown in FIG. 1J except that the ribs 142k of the side wall barrier structures 140k of the package 100k are disposed on the second substrate 120.

FIG. 1L is a schematic cross-sectional view illustrating a package of an environmentally sensitive electronic device in accordance with another embodiment of the present invention. Referring to FIG. 1L, the package 100l shown in FIG. 1L is similar to the package 100k shown in FIG. 1K except that the ribs from the side wall barrier structures 140l1 and 140l2 of the package 100l include a plurality of first ribs 142l1 and a plurality of second ribs 142l2, wherein the first ribs 142l1 are disposed on the first substrate 110, the second ribs 142l2 are disposed on the second substrate 120, the first ribs 142l1 and the second ribs 142l2 are alternately arranged.

The following are various embodiments illustrating a manufacturing method of an environmentally sensitive electronic device. The package 100a shown in FIG. 1A having an environmentally sensitive electronic device is described as an example. FIG. 2A to FIG. 2F complement the description of the manufacturing method in more detail.

Figure 2A:
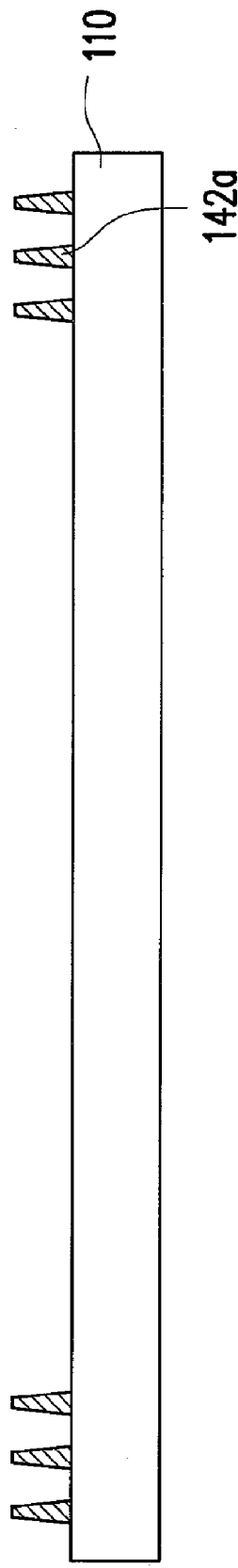
FIG. 2A to FIG. 2F are schematic cross-sectional views illustrating a packaging method of an environmentally sensitive electronic device in accordance with one embodiment of the present invention. Herein, the companion figures (a) to (e) to FIG. 2A and FIG. 2B are schematic cross-sectional views illustrating the first substrate, the environmentally sensitive electronic device, and the barrier structures at various formation orders.

FIG. 2A to FIG. 2F are schematic cross-sectional views illustrating a method to manufacture packages having environmentally sensitive electronic devices in accordance with one embodiment of the present invention. Referring first to FIG. 2A(a), in the present embodiment of the method to manufacture packages having environmentally sensitive electronic devices, an active device 132 (or a passive device) is firstly formed on a first substrate 110. The first substrate 110 is a flexible substrate or a rigid substrate, for instance. In the present embodiment of the invention, a material for the flexible substrate is polyethylene terephthalate (PET), polyethylene naphthalate (PEN), polyethersulfone (PES), polymethylmathacrylate (PMMA), polycarbonate (PC), polyimide (PI), or metal foil. The flexible substrate 110 can be a touch-sensing substrate. For instance, the flexible substrate 110 cam be a surface capacitive touch-sensing, a digital matrix touch-sensing (e.g. a projected capacitive touch-sensing), or an analogue matrix touch-sensing substrate. A material for the rigid substrate can be glass.

Figure 2B:
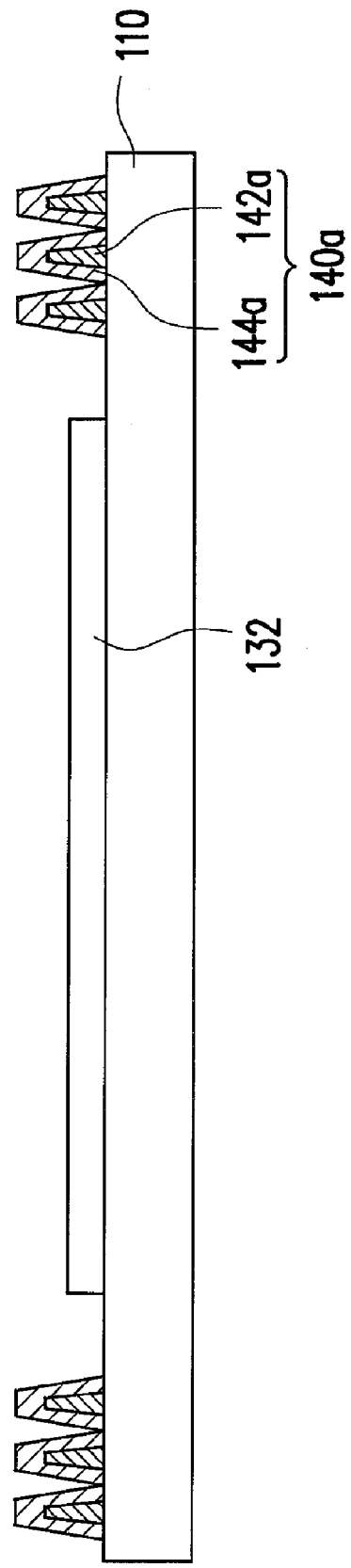
Figure 2A:
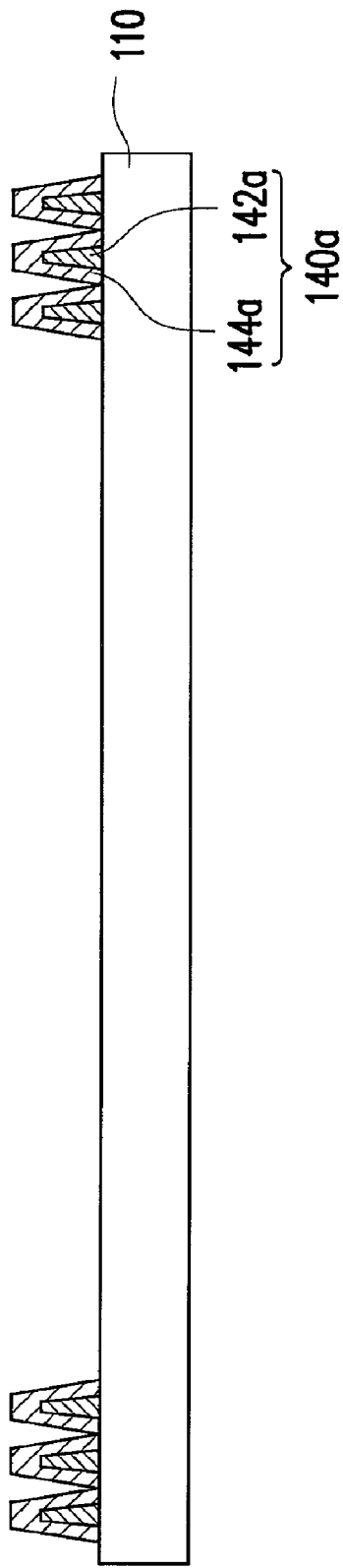
Figure 2B:
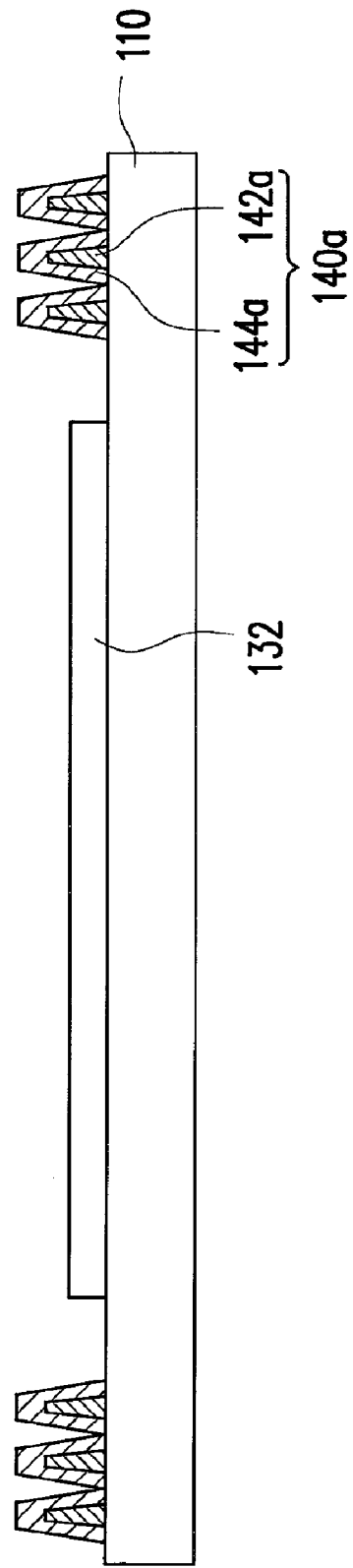
Figure 2A:
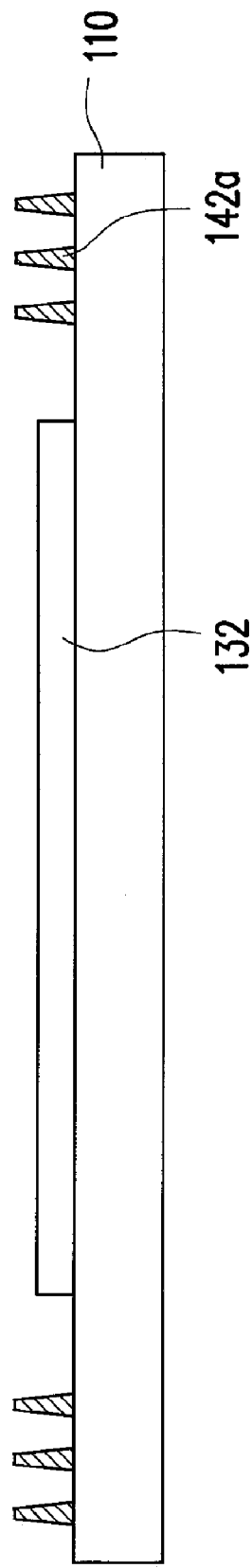
Figure 2B:
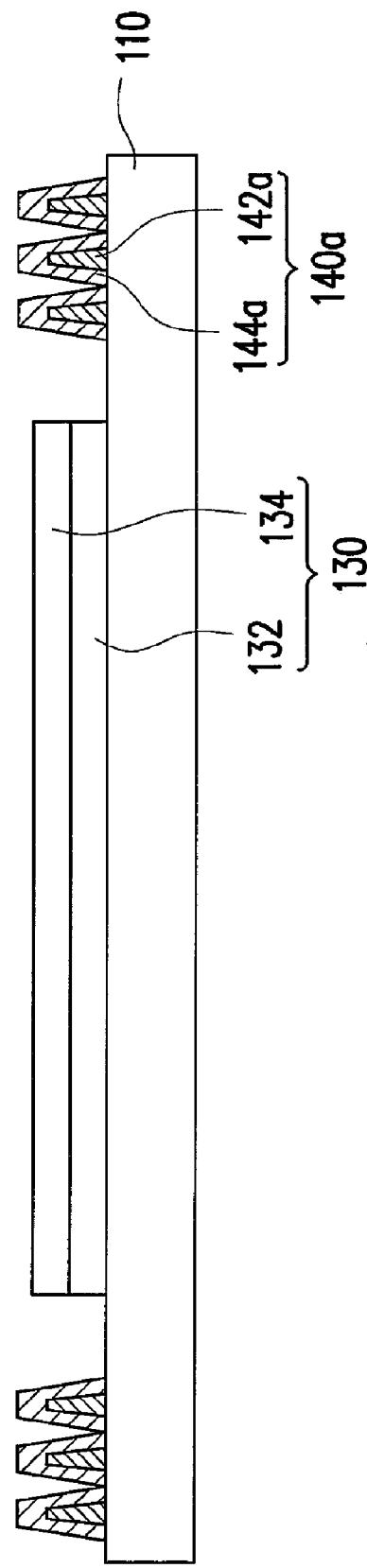

As shown in FIG. 2B(a), a plurality of side wall barrier structures 140a is then formed on the first substrate 110. The barrier structures 140a surround the active device 132, and the water vapor transmission rate of the side wall barrier structures 140a is less than $10^{-1}$ g/m$^2$/day. Preferably, the water vapor transmission rate of the side wall barrier structures 140a is less than $10^{-2}$ g/m$^2$/day.

Furthermore, each of the side wall barrier structures 140a includes a rib 142a and a barrier layer 144a. The ribs 142a are disposed on the first substrate 110, and the smallest cross-sectional shape of the ribs 142a is a trapezoidal shape, for instance. The barrier layer 144a covers the ribs 142a, and the ribs 142a are spaced at equidistant intervals. Moreover, the material of the ribs 142a includes an organic polymer material or a organic-inorganic mixed material. The organic polymer material is a positive photoresist or a negative photoresist, for instance. The material of the barrier layers 144a includes an inorganic material, and the inorganic material is silicon oxide, silicon nitride, silicon oxynitride, or aluminum oxide, for instance. In addition, the material of the barrier layers 144a includes a metallic material, and the metallic material includes molybdenum, titanium, aluminum, chromium, molybdenum/aluminum/molybdenum, or titanium/aluminum/titanium, for instance.

Figure 2C:
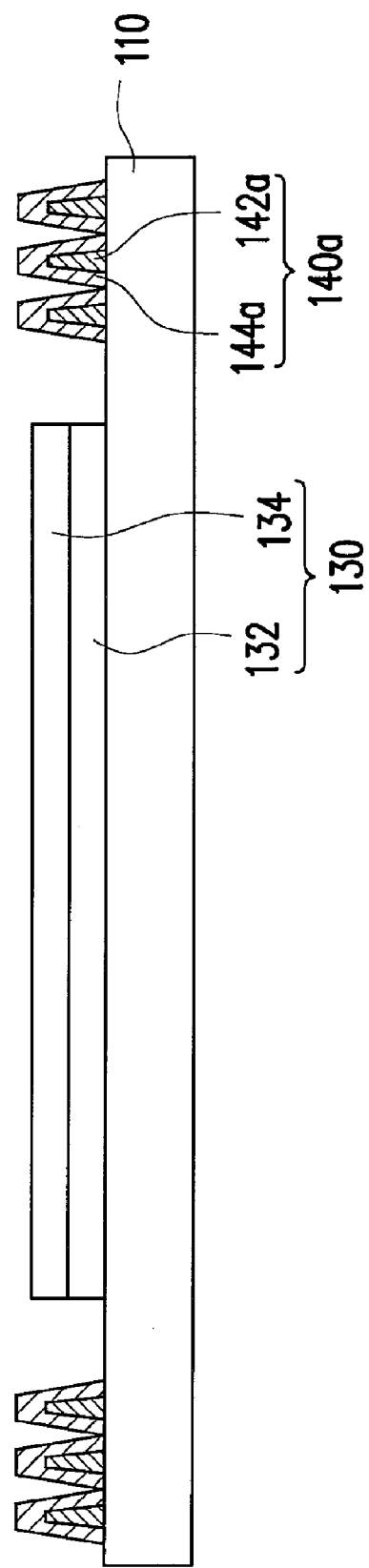

Next, as shown in FIG. 2C, a display medium 134 is formed on the active device 132 (or a passive device). An environmentally sensitive electronic device 130 is formed by the combination of the active device 132 and the display medium 134. In the present embodiment of the invention, the environmentally sensitive electronic device 130 is, for instance, an active environmentally sensitive display device, or a passive environmentally sensitive display device. The active environmentally sensitive display device includes, for instance, an Active Matrix Organic Light Emitting Diode (AM-OLED), an Active Matrix Electro Phoretic Display (AM-EPD), an Active Matrix Liquid Crystal Display (AM-LCD), or an Active Matrix Blue Phase Liquid Crystal Display. The passive environmentally sensitive display device includes, for instance, a Passive Matrix OLED (PM-OLED) or a Super Twisted Nematic Liquid Crystal Display (STN-LCD).

It should be noted that in the aforementioned method of packaging the environmentally sensitive electronic devices, the active device 132 (or a passive device) is formed first on the first substrate 110. Next, the side wall barrier structures 140a, which surround the active device 132, are formed on the first substrate 110. Afterwards, the display medium 134 is formed on the active device 132. However, in other embodiments of the present invention, the formation order of the side wall barrier structures 140a and the active device 132 of the environmentally sensitive electronic device 130 may be different from what is shown in FIG. 2A(a) and FIG. 2B(a). For example, as shown in FIG. 2A(b) and FIG. 2B(b), the ribs 142a from the side wall barrier structures 140a can be formed first on the first substrate 110. Next, the active device 132 can be formed on the first substrate 110, and during the fabrication of the active device 132, the barrier layers 144a for covering the ribs 142a can be formed simultaneously. Alternatively, as shown in FIG. 2A(c) and FIG. 2B(c), the side wall barrier structures 140a can be formed first on the first substrate 110, after the active device 132 (or a passive device) is formed on the first substrate 110. Certainly, as shown in FIG. 2A(d) and FIG. 2B(d), the active device 132 (or a passive device) and the ribs 142a can be formed first on the first substrate 110. Afterwards, a display medium 134 and the barrier layers 144a are formed to cover the active device 132 (or a passive device) and the ribs 142a, respectively. Alternatively, as shown in FIG. 2A(e) and FIG. 2B(e), an active device 132 (or a passive device) and the side wall barrier structures 140a are formed first on the first substrate 110, and then a display medium 134 is formed on the active device 132 (or a passive device). These formation orders are part of the technical solutions of the present invention, and these alternate formation orders do not limit the scope of the present invention.

Although the aforementioned side wall barrier structures 140a are formed on the first substrate 110, the side wall barrier structures 140a in other embodiments can be formed on the second substrate 120. In other words, the ribs 142a of the side wall barrier structures 140a can be formed on the second substrate 120, and the barrier layers 144a cover the ribs 142a. These implications can be understood by referring to the relative locations of the rib 142b, the barrier layer 144b, and the second substrate 120 shown in FIG. 1B. Similarly, in other embodiments of the present invention, the ribs 142a can be formed on both the first substrate 110 and the second substrate 120, wherein the ribs 142a on the first substrate 110 and the ribs 142a on the second substrate 120 are alternately arranged. As shown in FIG. 1C, the relative locations of the first rib 142c1, the second rib 142c2, the first substrate 110, and the second substrate 120 illustrated in FIG. 1C are also technical solutions to be protected by the present invention.

Figure 2D:
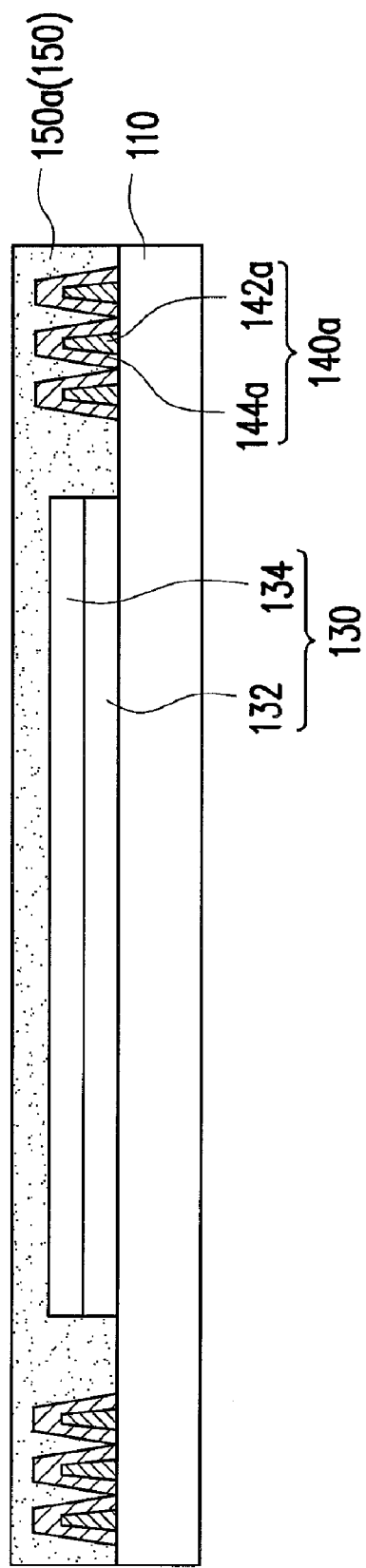

Next, as shown in FIG. 2D, a fill 150 is formed on the first substrate 110 to cover the environmentally sensitive electronic device 130 and the side wall barrier structures 140a. The thickness of the fill 150 is greater than the thickness of the side wall barrier structures 140a. In the present embodiment of the invention, the material of the fill 150 is acrylic resin or epoxy resin, for instance. The fill 150 is a pressure sensitive type glue or a fill type glue, for example.

Figure 2E:
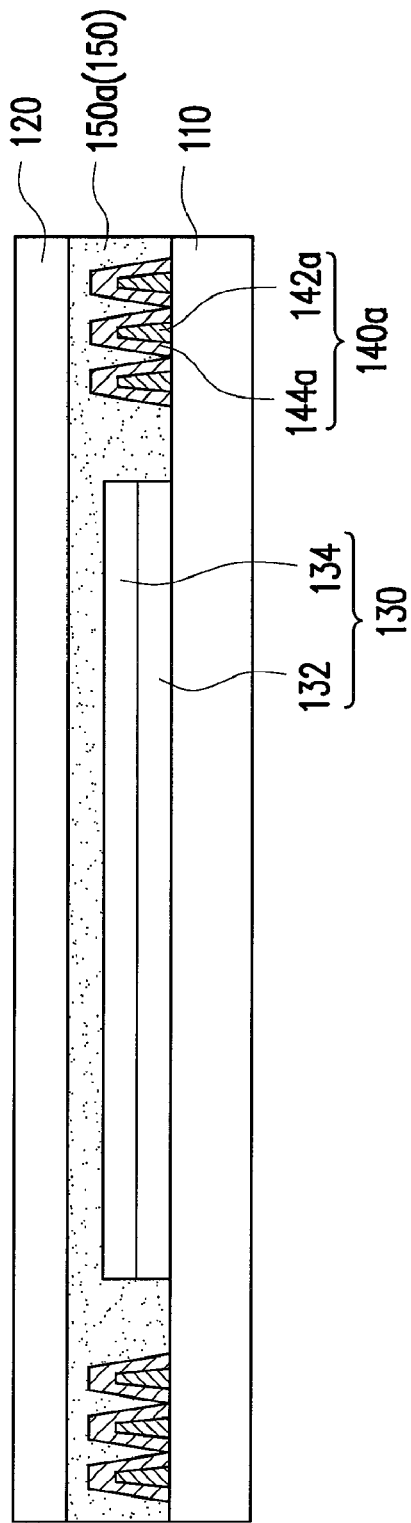
Figure 2F:
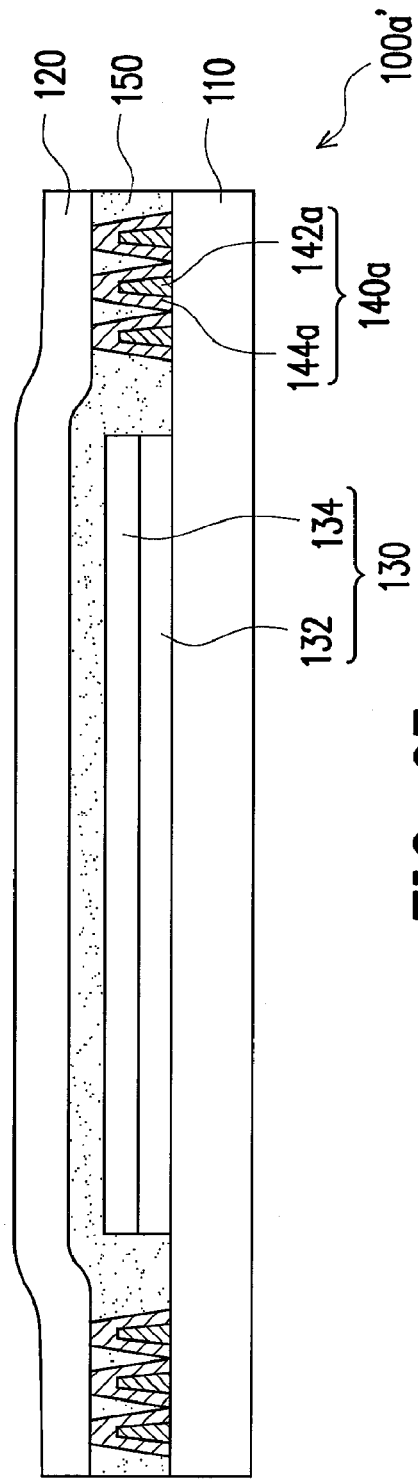

As shown in FIG. 2E, the second substrate 120 is pressed on the glue 150a. Afterwards, as shown in FIG. 2F, tight contact between the second substrate 120 and the side wall barrier structures 140a is made with use of an alignment roller or a frame press. The package 100a' having the environmentally sensitive electronic device is thereby complete.

When the fill 150 is a fill type glue, the formation of the fill 150 involves the following steps. First, a glue 150a is formed on the first substrate 110 (as shown in FIG. 2D) in order to cover the environmentally sensitive electronic device 130 and the side wall barrier structures 140a. After using the alignment roller or the frame press to force the second substrate 120 and the side wall barrier structures 140a into close contact, a curing process is performed to solidify the glue 150a and form the fill 150. The glue 150a is solidified by ultraviolet curing or thermal curing. When the fill 150 is a pressure sensitive type glue, the following steps are involved. First, a double-sided tape (not drawn) is adhered to the first substrate 110 so as to cover the environmentally sensitive electronic device 130 and the side wall barrier structures 140a. Afterwards, the alignment roller or the frame press is used to force the second substrate 120 and the side wall barrier structures 140a into close contact. The package 100a' having the environmentally sensitive electronic device is then completely manufactured.

In other words, in the present embodiment of the invention, the side wall barrier structures 140a are formed first on the first substrate 110, and then afterwards the fill 150 is formed to cover the side wall barrier structures 140a and the environmentally sensitive electronic device 130. The fill 150, the barrier layers 144a, and the ribs 142a (the latter two from the barrier structures 140a) have pressure dispersive characteristics due to their materials. The material of the fill 150, the barrier layers 144a, and the ribs 142a is an organic material, an inorganic material, and an organic material (or a organic-inorganic mixed material), respectively. In addition, the side wall barrier structures 140a are located between the first substrate 110 and the second substrate 120. The side wall barrier structures 140a also surround the environmentally sensitive device 130, and the structures 140a have a water vapor transmission rate of less than $10^{-1}$ g/m²/day. Hence, the package 100a' in the present embodiment is resistant to water vapor and oxygen. Therefore, the package 100a' prolongs the life of the environmentally electronic sensitive device 130. Furthermore, when the package 100a' is bent the side wall barrier structures 140a, acting as structural supports, disperse stress for the package 100a' having the environmentally sensitive electronic device.

In summary, the barrier structures of the present invention, located between the first substrate and the second substrate while also surrounding the environmentally sensitive device, have a water vapor transmission rate of less than $10^{-1}$ g/m²/day. Consequently, the package becomes well resistant against water vapor and oxygen. As a result, the device's lifetime is enhanced. When the package is bent the side wall barrier structures also act as structural supports.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package of an environmentally sensitive electronic device, the package comprising:
    a first substrate;
    a second substrate disposed over the first substrate;
    an environmentally sensitive electronic device disposed on the first substrate and sandwiched between the first substrate and the second substrate;
    a plurality of side wall barrier structures disposed between the first substrate and the second substrate, wherein the barrier structures surround the environmentally sensitive electronic device, and a water vapor transmission rate of the barrier structures is less than $10^{-1}$ g/m²/day; and
    a fill disposed between the first substrate and the second substrate, wherein the filler covers the environmentally sensitive electronic device and the side wall barrier structures.

2. The package of the environmentally sensitive electronic device as claimed in claim 1, wherein each of the side wall barrier structures comprises:
    a rib disposed on the first substrate or the second substrate; and
    a barrier layer covering the rib, wherein the fill covers the barrier layer.

3. The package of the environmentally sensitive electronic device as claimed in claim 2, wherein the ribs are disposed on the first substrate and are spaced at equidistant intervals.

4. The package of the environmentally sensitive electronic device as claimed in claim 2, wherein the ribs are disposed on the second substrate and are spaced at equidistant intervals.

5. The package of the environmentally sensitive electronic device as claimed in claim 2, wherein the ribs comprise:
    a plurality of first ribs disposed on the first substrate; and
    a plurality of second ribs disposed on the second substrate, wherein the first ribs and the second ribs are alternately arranged.

6. The package of the environmentally sensitive electronic device as claimed in claim 2, wherein a smallest cross-sectional shape of the ribs comprises a trapezoidal shape, a triangular shape, or a rectangular shape.

7. The package of the environmentally sensitive electronic device as claimed in claim 2, wherein a smallest cross-sectional shape of the ribs comprises a bullet shape, and the bullet shape includes a rectangular portion and a rounding portion connected to an upper planar region of the rectangular portion.

8. The package of the environmentally sensitive electronic device as claimed in claim 2, wherein a material of the ribs comprises organic polymer materials or organic-inorganic hybrid materials.

9. The package of the environmentally sensitive electronic device as claimed in claim 2, wherein a material of the barrier layers comprises a metallic material.

10. The package of the environmentally sensitive electronic device as claimed in claim 9, wherein the metallic material comprises molybdenum, titanium, aluminum, chromium, molybdenum/aluminum/molybdenum, or titanium/aluminum/titanium.

11. The package of the environmentally sensitive electronic device as claimed in claim 2, wherein a material of the barrier layers comprises an inorganic material.

12. The package of the environmentally sensitive electronic device as claimed in claim 11, wherein the inorganic material comprises silicon oxide, silicon nitride, silicon oxynitride, or aluminum oxide.

13. The package of the environmentally sensitive electronic device as claimed in claim 1, wherein the environmentally sensitive electronic device comprises an active environmentally sensitive electronic display device or a passive environmentally sensitive electronic display device.

14. The package of the environmentally sensitive electronic device as claimed in claim 1, wherein the first substrate comprises a flexible substrate or a rigid substrate.

15. The package of the environmentally sensitive electronic device as claimed in claim 1, wherein the second substrate comprises a flexible substrate or a rigid substrate.

16. The package of the environmentally sensitive electronic device as claimed in claim 1, wherein the water vapor transmission rate of the side wall barrier structures is less than $10^{-2}$ g/m²/day.

17. A method of packaging an environmentally sensitive electronic device, comprising:
    forming an environmentally sensitive electronic device on a first substrate;

forming a plurality of side wall barrier structures on the first substrate or on the second substrate, wherein the side wall barrier structures surround a environmentally sensitive electronic device, and the water vapor transmission rate of the side wall barrier structures is less than $10^{-1}$ g/m²/day;

forming a fill on the first substrate to cover the environmentally sensitive electronic device and the side wall barrier structures; and pressing the second substrate on the fill.

18. The method of packaging the environmentally sensitive electronic device as claimed in claim 17, wherein a method of forming the side wall barrier structures comprises:

forming a plurality of ribs on the first substrate or the second substrate; and forming a plurality of barrier layers to cover the ribs.

19. The method of packaging the environmentally sensitive electronic device as claimed in claim 18, wherein a method of forming the side wall barrier structures comprises:

forming a plurality of first ribs on the first substrate; and forming a plurality of second ribs on the second substrate, wherein the first ribs and the second ribs are alternately arranged.

20. The method of packaging the environmentally sensitive electronic device as claimed in claim 17, wherein the side wall barrier structures are pressed through an alignment roller or a frame press process after pressing the second substrate on the fill, such that the barrier structures are in contact with the first substrate or the second substrate.

21. The method of packaging environmentally sensitive electronic device as claimed in claim 17, wherein a method of forming the fill comprises:

forming a glue on the first substrate to cover the environmentally sensitive electronic device and the side wall barrier structures.

22. The method of packaging the environmentally sensitive electronic device as claimed in claim 21, further comprising curing the glue to form the fill after forming the glue on the first substrate.

23. The method of packaging the environmentally sensitive electronic device as claimed in claim 22, wherein the glue is solidified by ultraviolet curing or thermal curing.

24. The method of packaging the environmentally sensitive electronic device as claimed in claim 17, wherein a method of forming the fill comprises adhering a double-sided tape onto the first substrate to cover the environmentally sensitive electronic device and the side wall barrier structures.

25. The method of packaging the environmentally sensitive electronic device as claimed in claim 17, wherein the water vapor transmission rate of the side wall barrier structures is less than $10^{-2}$ g/m²/day.

* * * * *